United States Patent [19]
Muresan et al.

[11] Patent Number: 6,091,346
[45] Date of Patent: Jul. 18, 2000

[54] MULTI-FLASH ANALOG TO DIGITAL CONVERTER USING FLOATING VOLTAGES

[76] Inventors: David Muresan; David D. Muresan, both of 18204 30th Ave. NE., Seattle, Wash. 98155

[21] Appl. No.: 08/461,149

[22] Filed: Jun. 5, 1995

[51] Int. Cl.[7] .................................................. H03M 1/12
[52] U.S. Cl. .......................... 341/56; 341/158; 341/159; 341/161; 341/155
[58] Field of Search ................................. 341/156, 158, 341/159, 161, 155

[56] References Cited

U.S. PATENT DOCUMENTS

| | | | |
|---|---|---|---|
| 5,093,664 | 3/1992 | Senn et al. | 341/156 |
| 5,119,098 | 6/1992 | Komatsu et al. | 341/159 |
| 5,187,483 | 2/1993 | Yonemaru | 341/156 |
| 5,355,135 | 10/1994 | Redfern | 341/156 |
| 5,450,085 | 9/1995 | Stewart et al. | 341/159 |

*Primary Examiner*—Jeffrey A. Gaffin
*Assistant Examiner*—Jason L. W. Kost

[57] ABSTRACT

A high resolution multi-flash analog-to-digital converter comprised of multiple small resolution full-flash analog-to-digital converters combined in such a manner as to generate a higher resolution digital voltage. The first small resolution analog-to-digital flash converter will generate the lowest order bits of the multi-flash analog-to-digital converter. The second small resolution analog-to-digital flash converter will generate the next higher order bits of the multi-flash analog-to-digital converter, and so on, until the last small resolution analog-to-digital flash converter will generate the most significant order bits of the multi-flash analog-to-digital converter.

1 Claim, 1 Drawing Sheet

6,091,346

MULTI-FLASH ANALOG TO DIGITAL CONVERTER USING FLOATING VOLTAGES

BACKGROUND OF THE INVENTION

This invention refers to an analog-to-digital (A/D) flash converter used to convert or to measure an analog signal Vin (input voltage) in a digital number.

The existing full flash converters use a schematic with comparators having the same voltage increment between two consecutive comparators. (e.g. An 8 bit full flash converter uses 255 comparators for 2.55 V, with 10 mV voltage increment). The converter will change the digital output with one for each 10 mV change of the analog input signal. The voltage increment is provided by a 256 resistor ladder.

The existing two-step or semi-flash A/D converter has 31 comparators and consists of two 4-bits flash conversions, one for least significant bits (LS) and one for most significant bits (MS). The 4 LS bits are combined with the 4 MS bits as the 8-bit digital number.

The disadvantages of the full flash converter are the high number of comparators and a complicated encoder, which will increase the converter volume and price. The semi-flash converter still has a part of the above disadvantages.

SUMMARY OF THE INVENTION

The object of the present invention is a multi-flash AD converter, which allows to obtain two or more groups of bits: LS, MS and inside-significant bits (IS1, IS2 and so on).

In order to do that, two or more full flash converters (cells of comparators) are used. The cells for inside-significant bits are called mid-cells. The comparators are supplied from the main power supply V, which has the negative terminal connected to the case, called ground with its potential of 0V. The resistor ladders of LS, IS1 and IS2 are connected to floating voltages. Floating voltages hasn't any terminal connected to the case and the potential of their terminals may vary with respect of the ground. The resistor ladder provides the voltage increment between the comparators' negative inputs.

The MS cell has the resistor ladder connected to the main power supply. So the number floating voltages is the number of cells minus one. A cell may have any number of comparators (e.g. 7 for octal, 9 for decimal and 15 for hexadecimal ). For decimal, each cell represents a digit of the digital number. For octal and hexadecimal the combination of all the cells outputs is the binary number. The comparator may be ON or OFF. It is said to be ON if the voltage on the positive input terminal is higher than the voltage on the negative input terminal and the output is high. It is said to be OFF if the voltage on the positive input terminal is lower than the voltage on the negative input terminal and the output is low. A cell is ON if all its comparators are ON and a cell is OFF if all its comparators are OFF. High resolution means low voltage increment in the LS cell.

This invention eliminates the disadvantages of a full and semi-flash converters by reducing the number of comparators to minimum possible (from 255 or 31 to 20). The advantage is more visible if the range of the input voltage is large and the voltage increment between comparators is low. For example, to measure 5V with 1 mV increment, a full flash converter would use 5000 comparators with a 5000 resistor ladder, while the multi-flash converter uses 54 comparators (4 cells), 4 resistors ladders of 9 resistors each and 3 floating voltages. The price of a floating voltage is very low. The floating voltage may be a battery or a voltage created with a transformer.

DETAILED DESCRIPTION OF ILLUSTRATIVE EMBODIMENT

Figure 1:
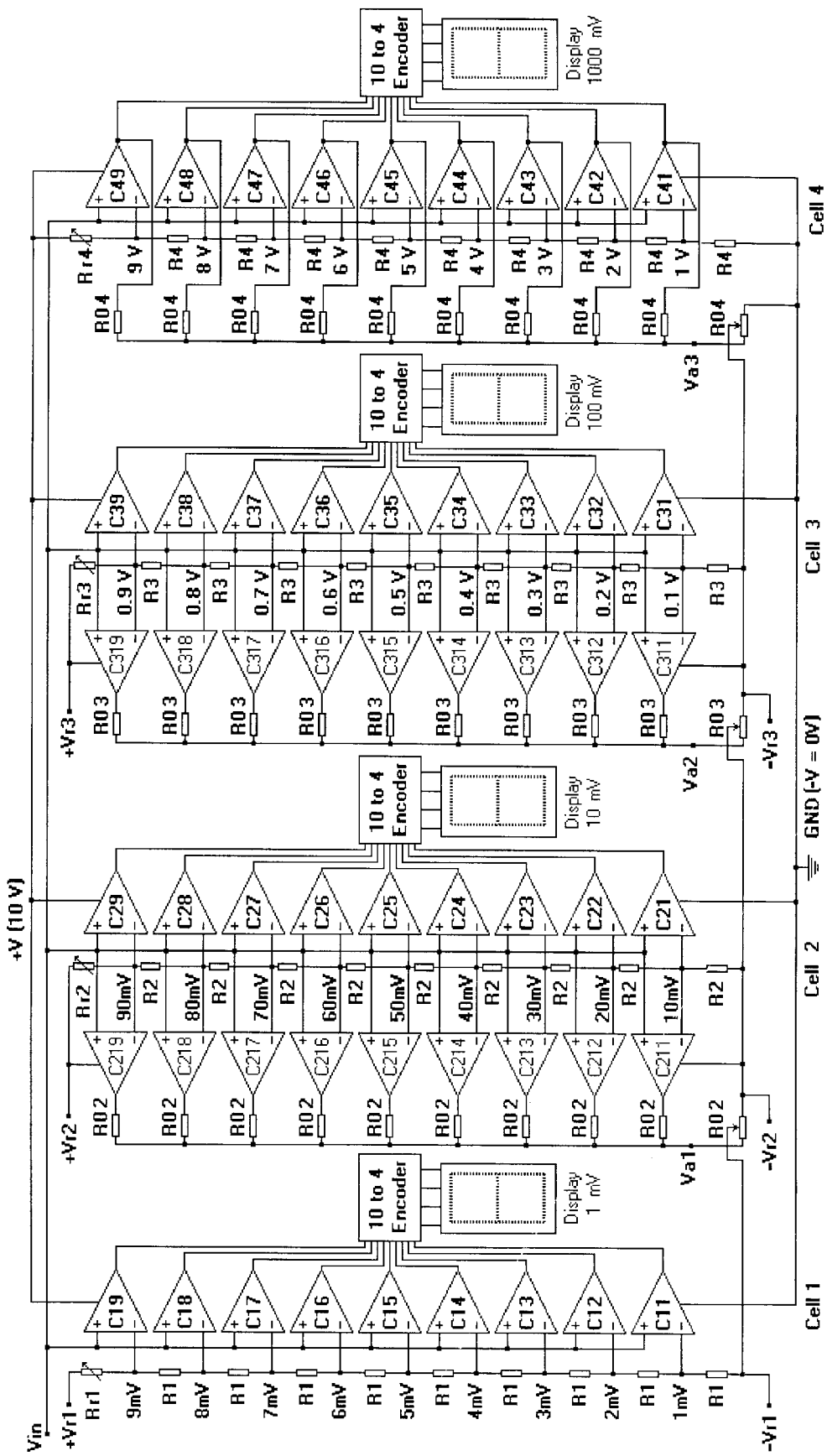
FIG. 1 is a decimal multi-flash (4-flash) A/D converter.

In FIG. 1 is a multi-flash (4-flash) decimal A/D converter with 4 cells and 9 comparators per cell. The converter has 3 floating voltages Vr1, Vr2 and Vr3. Rr1, Rr2 and Rr3 connect the resistor ladders R1, R2 and R3 to the floating voltages and they adjust the voltage increment to 1 mV in the cell 1, to 10 mV in the cell 2 and to 100 mV in the cell 3. The Rr4 connects the resistor ladder R4 to the main power supply and adjust the voltage increment to 1 V. in cell 4. The voltage divider with the resistors R02 equal with the potentiometer R02 will increase Va1 with Vr2/10 and the the potential of −Vr1 with 10 mV, with respect of −Vr2, any time a new comparator of C211 to C219 will turn ON. The comparators C211 to C219, switch when comparators C21 to C29 switch. The voltage divider with the resistors R03 equal with the potentiometer R03 will increase Va2 with Vr3/10 and the potential of −Vr2 with 100 mV, with respect of −Vr3, any time a new comparator of C311 to C319 will turn ON. The comparators C311 to C319, switch when comparators C31 to C39 switch. The voltage divider with the resistors R04 equal with the potentiometer R04 will increase Va3 with V/10 and the potential of −Vr3 with 1000 mV, with respect of the ground, any time a new comparator of C41 to C49 will turn ON. When Vin=9 mV cell 1 (C11 to C19) is ON. The number 0000 0000 0000 1001 When Vin=10 mV, C21 turns ON, the cell 1 turns OFF. The number is 0000 0000 0001 0000 When Vin=100 mV, C31 turns ON, the cell 1 and 2 turn OFF. The number is 0000 0001 0000 0000, because −Vr2 increased to 100 mV and both cell 1 and cell 2 have on the positive input terminal 100 mV and on the negative input terminal more voltage, provided by the resistor ladders R1, and R2. When Vin =101 mV the C11 turns ON. The number is 0000 0001 0000 0001 When Vin=111 mV C21 turns ON. The number is 0000 0001 0001 0001 and so on. When Vin=1000 mV C41 turns ON. and cell 1, 2 and 3 turn OFF. The number is 0001 0000 0000 0000 When Vin=9999 mV all cells turn ON. The number is 111 1111 1111 1111

We claim:

1. A multi-flash, high resolution analog to digital converter for converting an analog input signal to bits of digital data, comprising an input terminal for receiving said analog input signal;

a main power supply with a positive terminal and a ground terminal;

a floating voltage power supply with a positive terminal and a negative terminal;

cells of comparators, including a first cell for least significant bits, a last cell for most significant bits, and mid-cells for inside significant bits;

in each of said cells, a group of primary comparators powered by said main power supply, each comparator having a negative and a positive input terminal;

in each of said cells except said last cell, a group of secondary comparators powered by said floating voltage power supply, each comparator having a positive and a negative input terminal;

in said last cell, a resistor ladder with one end connected to said main power supply positive terminal and the other end connected to said main power supply ground terminal, for providing reference voltages to said negative terminals of said primary comparators;

in each of said cells except said last cell, a resistor ladder with one end connected to said floating voltage power supply positive terminal and the other end connected to said floating voltage power supply negative terminal, for providing reference voltages to said negative terminals of said primary comparators; and a voltage divider which spans from said last cell to said first cell, for successively turning on or off said groups of primary comparators in response to said analog input voltage;

wherein said groups of secondary comparators control the ratio of voltage division by said voltage divider.

* * * * *